(12) United States Patent
Wang et al.

(10) Patent No.: US 11,177,132 B2
(45) Date of Patent: Nov. 16, 2021

(54) SELF ALIGNED BLOCK MASKS FOR IMPLANTATION CONTROL

(71) Applicant: INTERNATIONAL BUSINESS MACHINES CORPORATION, Armonk, NY (US)

(72) Inventors: Junli Wang, Slingerlands, NY (US); Romain Lallement, Troy, NY (US); Ardasheir Rahman, Schenectady, NY (US); Liying Jiang, Guilderland, NY (US); Brent A. Anderson, Jericho, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 76 days.

(21) Appl. No.: 16/502,172

(22) Filed: Jul. 3, 2019

(65) Prior Publication Data

US 2021/0005459 A1    Jan. 7, 2021

(51) Int. Cl.
  *H01L 21/266* (2006.01)
  *H01L 21/265* (2006.01)
  *H01L 21/027* (2006.01)

(52) U.S. Cl.
  CPC ........ *H01L 21/266* (2013.01); *H01L 21/0276* (2013.01); *H01L 21/26513* (2013.01)

(58) Field of Classification Search
  CPC ............... H01L 21/266; H01L 21/0276; H01L 21/26513
  See application file for complete search history.

(56) References Cited

U.S. PATENT DOCUMENTS

| 4,135,954 | A  |   | 1/1979  | Chang et al. |
| 5,618,688 | A  |   | 4/1997  | Reuss et al. |
| 5,899,727 | A  |   | 5/1999  | Hause et al. |
| 6,214,656 | B1 |   | 4/2001  | Liaw |
| 6,465,870 | B2 |   | 10/2002 | Voldman |
| 6,498,061 | B2 |   | 12/2002 | Divakaruni et al. |
| 7,101,763 | B1 |   | 9/2006  | Anderson et al. |
| 7,144,767 | B2 |   | 12/2006 | Chidambarrao et al. |
| 7,517,637 | B2 |   | 4/2009  | Colburn et al. |
| 7,993,816 | B2 |   | 8/2011  | Black et al. |
| 8,252,670 | B2 |   | 8/2012  | Fedeli |
| 8,329,499 | B2 |   | 12/2012 | Banghart et al. |
| 9,646,883 | B2 |   | 5/2017  | Brink et al. |
| 9,960,086 | B2 |   | 5/2018  | Park et al. |
| 2003/0077875 | A1 |   | 4/2003 | Mandelman et al. |
| 2004/0137670 | A1 |   | 7/2004 | Chen et al. |
| 2004/0183139 | A1 | * | 9/2004 | Kim ................. H01L 21/76229 257/374 |
| 2005/0037594 | A1 | * | 2/2005 | Wu .................. H01L 21/76229 438/452 |
| 2010/0117153 | A1 | * | 5/2010 | Lucking ........... H01L 29/78621 257/351 |

(Continued)

*Primary Examiner* — Michele Fan
(74) *Attorney, Agent, or Firm* — Tutunjian & Bitetto, P.C.; Erik Johnson (57) ABSTRACT

Methods for doping a semiconductor layer include forming a first mask on a first region of a semiconductor layer. A second region of the semiconductor layer, that is not covered by the first mask, is doped. A second mask is formed on the second region of the semiconductor layer. The first mask is etched away. The first region of the semiconductor layer is doped.

15 Claims, 4 Drawing Sheets

(56) References Cited

U.S. PATENT DOCUMENTS

| | | | |
|---|---|---|---|
| 2011/0108921 A1* | 5/2011 | Kanakasabapathy | ........................ H01L 21/3105 257/369 |
| 2011/0291284 A1* | 12/2011 | Goldfarb | ........... H01L 21/02274 257/773 |
| 2012/0270389 A1* | 10/2012 | Lin | .................... H01L 21/31144 438/627 |
| 2015/0332934 A1* | 11/2015 | Yu | ........................ H01L 29/7851 257/288 |
| 2017/0309560 A1* | 10/2017 | Bouche | ............. H01L 21/76897 |
| 2017/0345913 A1* | 11/2017 | Dai | .................... H01L 29/66795 |
| 2017/0365561 A1* | 12/2017 | Shiu | .................. H01L 21/02164 |
| 2018/0138187 A1* | 5/2018 | Ogino | ................. H01L 21/0337 |
| 2019/0279901 A1* | 9/2019 | Lin | ...................... H01L 21/0274 |
| 2020/0105529 A1* | 4/2020 | Ghandi | ............... H01L 29/0634 |

* cited by examiner

SELF ALIGNED BLOCK MASKS FOR IMPLANTATION CONTROL

BACKGROUND

The present invention generally relates to semiconductor device fabrication and, more particularly, to the formation of self-aligned block masks that reduce variability in dopant implantation regions.

When forming devices, such as field effect transistors, different regions of a substrate can be formed with different dopant types. These regions can be formed close together, even abutting one another, to maximize the number of devices that can be fit on a single chip. However, the process of forming masks is error-prone, with some amount of variance in the region boundaries resulting from mask lithography overlay control imprecision. The mispositioning of boundaries between n-well and p-well structures can result in large current leakage between, for example, an n-well region on one side of an isolation structure and an n-type doped region on another side of an isolation structure.

SUMMARY

A method for doping a semiconductor layer includes forming a first mask on a first region of a semiconductor layer. A second region of the semiconductor layer, that is not covered by the first mask, is doped. A second mask is formed on the second region of the semiconductor layer. The first mask is etched away. The first region of the semiconductor layer is doped.

A method for doping a semiconductor layer includes forming a first mask on a first region of a semiconductor layer by forming an organic planarizing layer on the semiconductor layer, forming a hardmask layer on the organic planarizing layer, and patterning the organic planarizing layer and the hardmask layer to remove material from the organic planarizing layer and the hardmask layer outside of the first region of the semiconductor layer. A second region of the semiconductor layer, that is not covered by the first mask, is doped. A second mask is formed on the second region of the semiconductor layer by depositing a second mask material to a height above the first mask in both the first region and the second region and polishing the second mask material down to a height of the first mask, so that no second mask material remains in the first region. The first mask is etched away. The first region of the semiconductor layer is doped.

A method for doping a semiconductor layer includes forming a first mask on a first region of a semiconductor layer by forming an organic planarizing layer on the semiconductor layer, forming a hardmask layer on the organic planarizing layer, and patterning the organic planarizing layer and the hardmask layer to remove material from the organic planarizing layer and the hardmask layer outside of the first region of the semiconductor layer. A second region of the semiconductor layer, that is not covered by the first mask, is doped. The second region abuts the first region without overlap. A second mask is formed on the second region of the semiconductor layer by depositing a second mask material to a height above the first mask in both the first region and the second region, and polishing the second mask material down to a height of the first mask, so that no second mask material remains in the first region. The first mask is etched away after forming the second mask using an etch process that selectively removes material from the first mask without substantially damaging the second mask. The first region of the semiconductor layer is doped.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention use a self-aligned implantation blocking mask to decrease boundary placement errors between regions of differing dopant types. In particular, a first mask can be formed to block implantation in a first region while a second region is doped. A film can be formed after the first implantation, over the first mask. The film and the first mask are then removed from the first region, leaving the film in place in the second region to act as a second mask during implantation of the first region.

The second mask (the film) is thereby formed in a self-aligned manner with the first mask. Because a second lithography process is not needed to form the second mask, the errors that can result in lithographic boundary definition will not be compounded. Thus, there will not be regions where there is a substantial gap between the two implanted regions, nor will there by regions where implantation overlaps.

Figure 1:
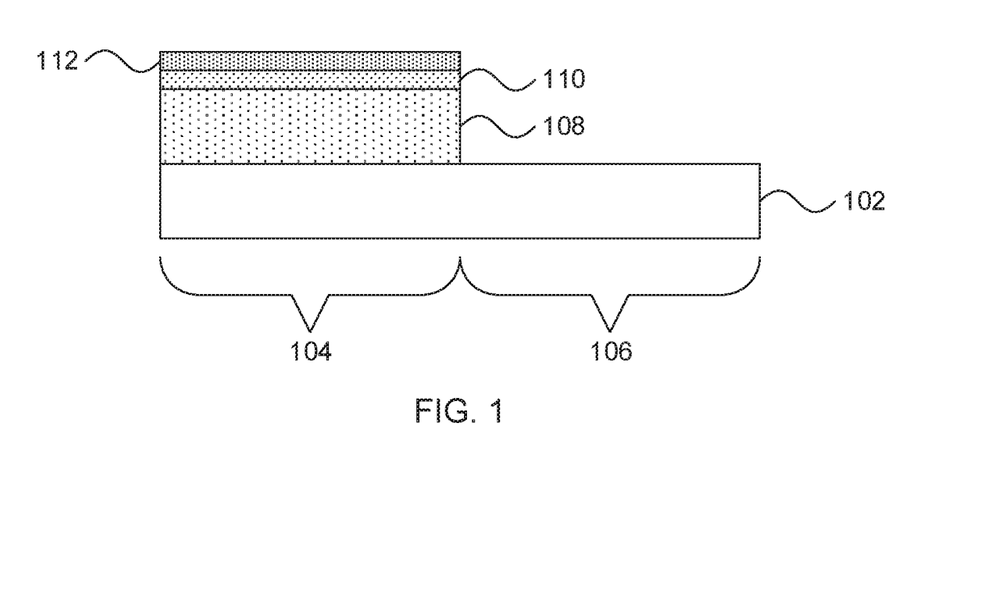
FIG. 1 is a cross-sectional view of a step in the doping of self-aligned regions of a semiconductor layer that shows the formation of a first mask in a first region of the semiconductor layer in accordance with an embodiment of the present invention.

Referring now to the drawings in which like numerals represent the same or similar elements and initially to FIG.

1, a cross-sectional view of a step in a process for doping respective regions of a semiconductor device is shown. A semiconductor substrate 102 includes a first region 104 and a second region 106. A mask is formed on the first region 104 and includes an organic planarizing layer (OPL) 108, a hardmask 110, and an anti-reflection layer 112. The mask can be formed by any appropriate process, such as photolithography.

The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

The OPL 108 can include a photo-sensitive organic polymer that, when exposed to electromagnetic (EM) radiation, changes chemically to be removable by a developing solvent. Examples of photo-sensitive organic polymers may include polyacrylate resin, epoxy resin, phenol resin, polyamide resin, polyimide resin, unsaturated polyester resin, polyphenylenether resin, polyphenylenesulfide resin, or benzocyclobutene. More generally, the developable OPL 108 may be formed from any organic polymer and a photo-active compound having a molecular structure that can attach to the molecular structure of the organic polymer. The developable OPL 108 may, for example, be applied using spin coating technology or a flowable chemical vapor deposition (CVD) process.

The hardmask layer 110 can be formed on the OPL 108 using any appropriate deposition process and can be formed from, e.g., silicon nitride, titanium oxide, or any other appropriate hardmask material. The anti-reflection layer 112 can be formed from silicon or any other appropriate anti-reflection coating. Deposition processes that can be used to form the hardmask layer 110 and the anti-reflection layer 112 include CVD, physical vapor deposition (PVD), atomic layer deposition (ALD), and gas cluster ion beam (GCIB) deposition. Other exemplary hardmark materials include silicon oxynitrides, silicon carbides, silicon carbonitrides, etc. Spin-on dielectrics may also be utilized as a hardmask material including, but not limited to: silsequioxanes, siloxanes, and boron phosphate silicate glass (BPSG).

The gate dielectric layer 502 may be formed by any appropriate process including, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

To form the mask pattern, a patterned photoresist can be formed on the layer of hardmask material 110. The layer of hardmask material 110 to provide a block mask protecting the first region 104. A patterned photoresist can be produced by applying a blanket photoresist layer to the surface, exposing the photoresist layer to a pattern of radiation, and then developing the pattern into the photoresist layer utilizing resist developer. Etching of the exposed portion of the hardmask layer 110 and the OPL 108 that are overlying the first device region 104 may include an etch chemistry for removing the exposed portion of the hardmask material and having a high selectivity to at least the block mask that is present in the first region 104. In one embodiment, the etch process may be an anisotropic etch process, such as reactive ion etch (RIE).

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 2:
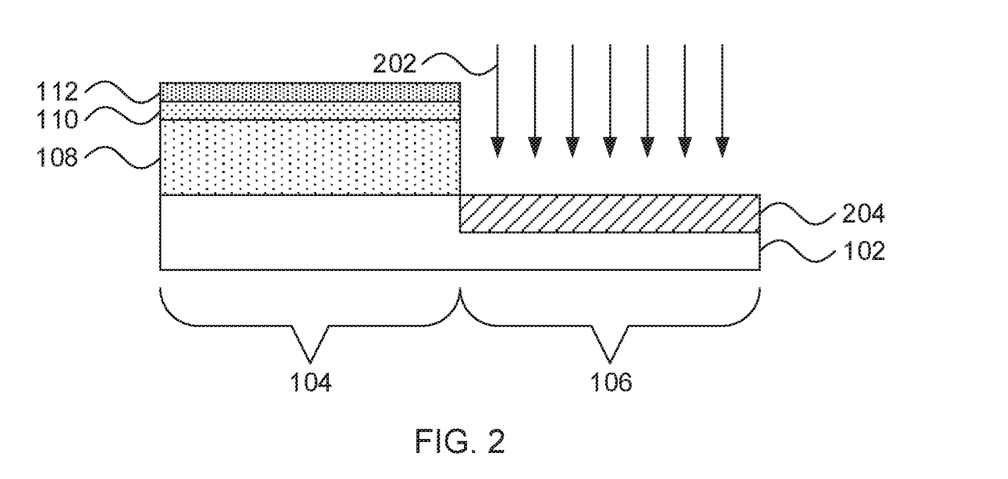
FIG. 2 is a cross-sectional view of a step in the doping of self-aligned regions of a semiconductor layer that shows the doping of a second region of the semiconductor layer around the first mask in accordance with an embodiment of the present invention.

Referring now to FIG. 2, a cross-sectional view of a step in a process for doping respective regions of a semiconductor device is shown. The second region 106 is doped by an implantation process using one or more appropriate dopant species. It is specifically contemplated that the second region may be doped with an n-type or p-type dopant species, according to the device that is being fabricated. Dopant ions 202 are accelerated toward the surface of the substrate 102 to form first doped region 204 in the second region 106.

As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium. As used herein, "n-type" refers to the addition of impurities that contributes free electrons to an intrinsic semiconductor In a silicon containing substrate examples of n-type dopants, i.e., impurities, include but are not limited to antimony, arsenic and phosphorous.

Ion implantation can be performed using an appropriate dopant species by accelerating ions of the dopant species with an appropriate implantation energy. The dopant ions strike the surface of the substrate 102 and become embedded therein. The implantation energy determines the depth to which the ions penetrate and can be used to set a dopant concentration profile. The ion implantation process provides a highly anisotropic effect, with dopant ions being driven into the substrate 102 in only the exposed second region 106, without substantially affecting the masked first region 104.

Figure 3:
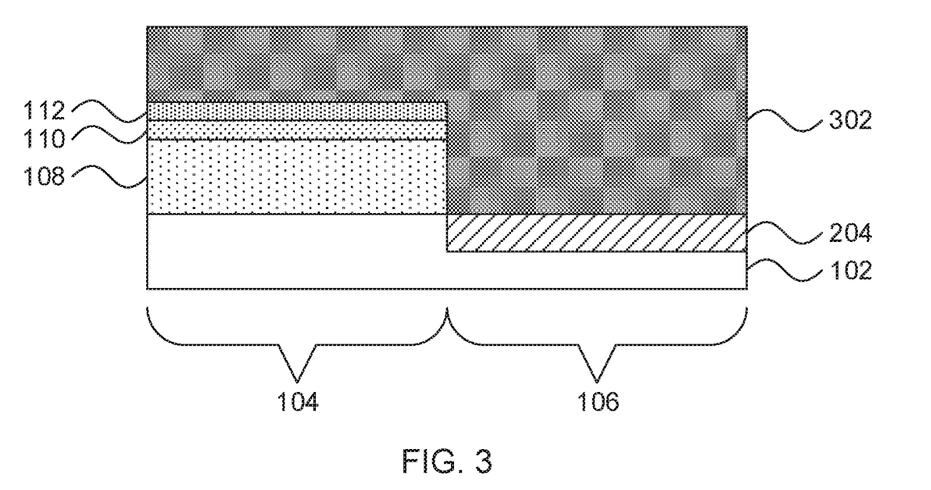
FIG. 3 is a cross-sectional view of a step in the doping of self-aligned regions of a semiconductor layer that shows the deposition of a second masking material across both the first region and the second region of the semiconductor layer in accordance with an embodiment of the present invention.

Referring now to FIG. 3, a cross-sectional view of a step in a process for doping respective regions of a semiconductor device is shown. A protective layer 302 is deposited over the substrate 102, including over the mask. It is specifically contemplated that the protective layer 302 can be formed from an oxide, such as silicon dioxide, using a low-temperature deposition process (e.g., under 200° C.). Although silicon dioxide is specifically contemplated, it should be understood that any appropriate masking material that has etch selectivity relative to the first hardmask 110 and the OPL 108 can be used. As used herein, the term "selective" in reference to a material removal process denotes that the rate of material removal for a first material is greater than the rate of removal for at least another material of the structure to which the material removal process is being applied.

Figure 4:
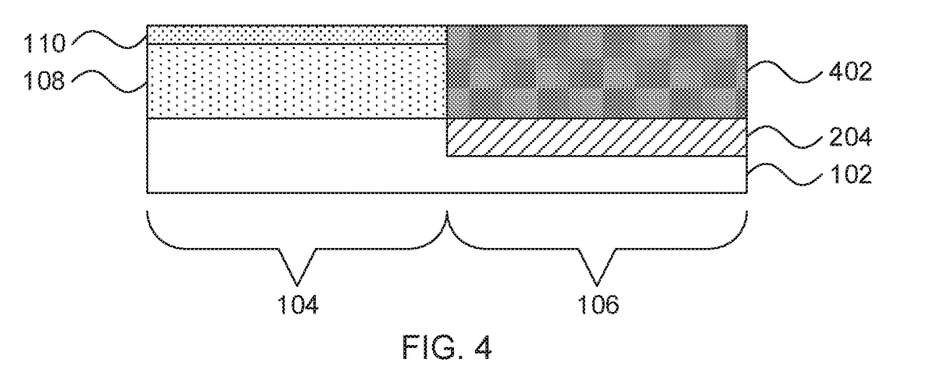
FIG. 4 is a cross-sectional view of a step in the doping of self-aligned regions of a semiconductor layer that shows the polishing of the second masking material down to form a second mask in the second region of the semiconductor layer in accordance with an embodiment of the present invention.

Referring now to FIG. 4, a cross-sectional view of a step in a process for doping respective regions of a semiconductor device is shown. The protective layer 302 is polished down to the level of the hardmask 110 to form second mask 402. A chemical mechanical planarization (CMP) process can be used to remove the material from the protective layer 302 and the anti-reflection layer 112. CMP can be performed using, e.g., a chemical or granular slurry and mechanical force to gradually remove upper layers of the device. The slurry may be formulated to be unable to dissolve, for example, the hardmask layer 110, resulting in the CMP process's inability to proceed any farther than that layer.

Figure 5:
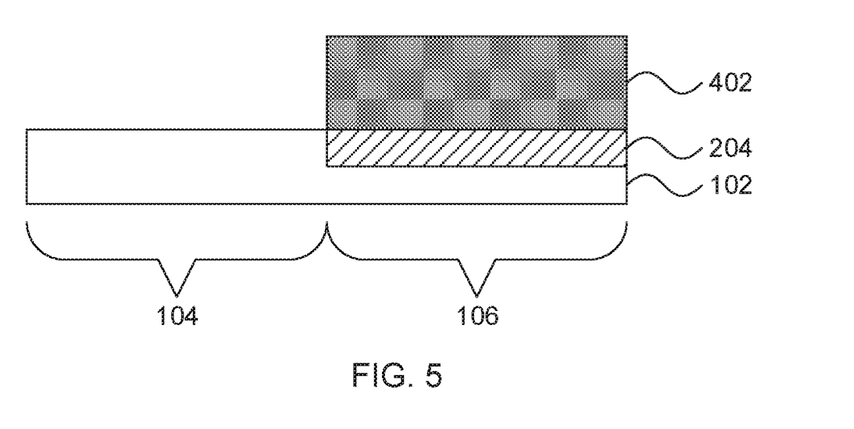
FIG. 5 is a cross-sectional view of a step in the doping of self-aligned regions of a semiconductor layer that shows the removal of the first mask from the first region of the semiconductor layer in accordance with an embodiment of the present invention.

Referring now to FIG. 5, a cross-sectional view of a step in a process for doping respective regions of a semiconductor device is shown. One or more selective etch processes are used to remove the material of the hardmask layer 110 and the OPL 108. It is specifically contemplated that the etch process or processes can remove the hardmask material and the organic planarizing material without substantially harming the material of the second mask 402 or the underlying substrate 102. Toward that end, any appropriately selective isotropic or anisotropic etch can be used.

Figure 6:
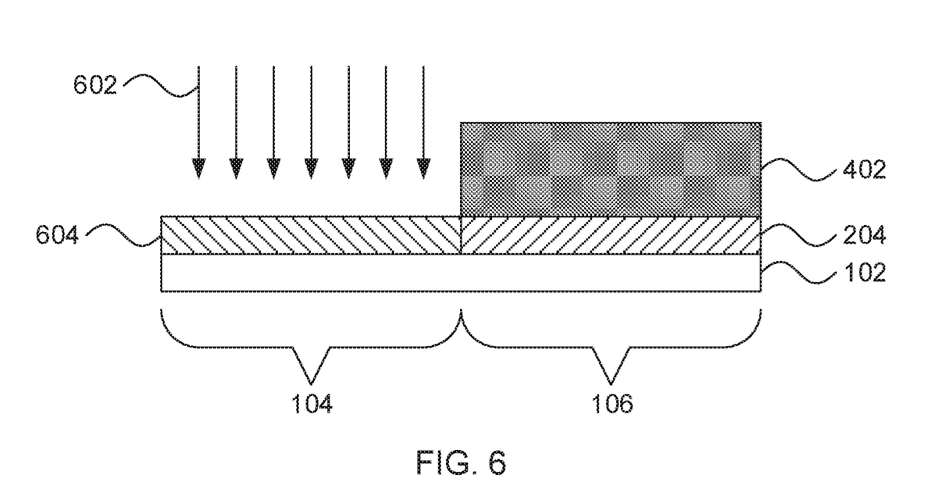
FIG. 6 is a cross-sectional view of a step in the doping of self-aligned regions of a semiconductor layer that shows the doping of the first region of the semiconductor layer in accordance with an embodiment of the present invention.

Referring now to FIG. 6, a cross-sectional view of a step in a process for doping respective regions of a semiconductor device is shown. A second implantation process is performed in the first region 104. The second implantation process uses a different dopant species as compared to the first implantation process. The dopant species of the second implantation process can be of the same conductivity type or of a different conductivity type. The dopant ions 602 are embedded into the surface of the substrate 102 to form second doped region 604. The second mask 402 can then be etched away, leaving behind the substrate 102 with two distinctly doped regions.

Because the masks are self-aligned to one another, the first doped region 204 and the second doped region 604 abut one another, with very little overlap or gaps in between. In this manner, edge placement errors between the regions can be reduced by over thirty percent. This prevents overdoping in regions which might otherwise be exposed to both doping processes, as well as regions that remain entirely undoped as a result of being covered by successive masks.

In contrast to the use of successive masks, where one mask is removed before the next mask is formed and where boundary errors can compound with each successive lithographic step, the present embodiments provide a substantial decrease in variation in the placement of the boundary between different dopant regions. In many cases, the reduction in boundary placement variation is decreased by nearly 30%.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease f description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 7:
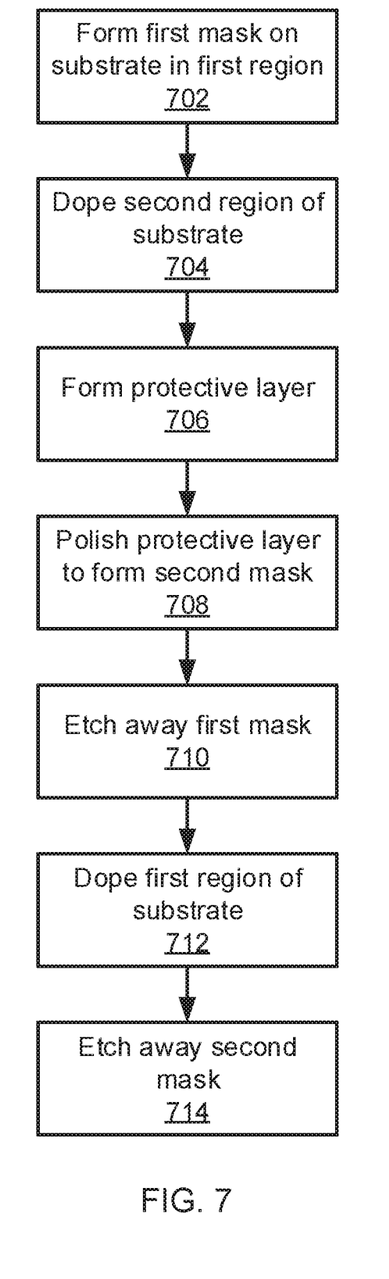
FIG. 7 is a block/flow diagram of a method for doping self-aligned regions of a semiconductor layer in accordance with an embodiment of the present invention.

Referring now to FIG. 7, a method of forming distinct doped regions on a substrate is shown. Block 702 forms the first mask on a first region 104 of the substrate 102, which can include an OPL 108 and a hardmask 110. Block 704 dopes a second region 106 of the substrate 102 using an appropriate dopant implantation process to form first doped region 202.

Block 706 forms protective layer 302 using a low-temperature process. Block 708 then polishes the protective layer 302 down to the height of the hardmask 110 to form second mask 402 in the second region 106. Block 710 etches away the first mask 110 to expose the surface of the first region 104 of the substrate 102.

Block 712 then dopes the first region 104 of the substrate 102 using a different dopant species as compared to the second region 106, for example using dopant ions of the same conductivity type or of a different conductivity type, to form the second doped region 604 in the first region 104. Block 714 then etches away the second mask 402.

Having described preferred embodiments of self-aligned block masks for implantation control (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for doping a semiconductor layer, comprising:
    forming a first mask on a first region of a semiconductor layer, the first mask including a planarizing layer, a hardmask layer on the planarizing layer, and an anti-reflection coating on the hardmask layer;
    doping a second region of the semiconductor layer that is not covered by the first mask, using a second dopant species of a second conductivity type, to form a second doped area;
    depositing a second mask material to a height above the first mask in both the first region and the second region;
    polishing the second mask material down to a height of the hardmask layer, so that the anti-reflection layer and the second mask material is removed in the first region, to form a second mask on the second region of the semiconductor layer;
    etching away the first mask; and
    doping the first region of the semiconductor layer, using a first dopant species of a first conductivity type, to form a first doped area that directly contacts the second doped area.

2. The method of claim 1, wherein forming the first mask comprises:
    forming an organic planarizing layer on the semiconductor layer;
    forming a hardmask layer on the organic planarizing layer; and
    patterning the organic planarizing layer and the hardmask layer to remove material from the organic planarizing layer and the hardmask layer outside of the first region of the semiconductor layer.

3. The method of claim 2, wherein forming the first mask further includes forming an antireflective coating on the hardmask layer before patterning the organic planarizing layer and the hardmask layer.

4. The method of claim 1, wherein etching away the first mask is performed after forming the second mask.

5. The method of claim 1, wherein etching away the first mask includes an etch process that selectively removes material from the first mask without substantially damaging the second mask.

6. The method of claim 1, wherein the first doped area and the second doped area abut one another without overlap.

7. The method of claim 1, wherein forming the first mask includes a lithographic process and wherein forming the second mask includes a deposition process followed by a chemical mechanical planarization process.

8. The method of claim 1, wherein etching away the first mask is performed after forming the second mask.

9. A method for doping a semiconductor layer, comprising:
   forming a first mask on a first region of a semiconductor layer by:
      forming an organic planarizing layer on the semiconductor layer;
      forming a hardmask layer on the organic planarizing layer;
      forming an anti-reflection layer on the hardmask layer, and
      patterning the organic planarizing layer, the hardmask layer, and the anti-reflection layer to remove material from the organic planarizing layer, the hardmask layer, and the anti-reflection layer outside of the first region of the semiconductor layer;
   doping a second region of the semiconductor layer that is not covered by the first mask, using a second dopant species of a second conductivity type, to form a second doped area;
   forming a second mask on the second region of the semiconductor layer by:
      depositing a second mask material to a height above the first mask in both the first region and the second region; and
      polishing the second mask material down to a height of the hardmask layer, so that the anti-reflection layer and the second mask material is removed in the first region;
   etching away the first mask; and
   doping the first region of the semiconductor layer, using a first dopant species of a first conductivity type, to form a first doped area that directly contacts the second doped area.

10. The method of claim 9, wherein forming the first mask further includes forming an antireflective coating on the hardmask layer before patterning the organic planarizing layer and the hardmask layer.

11. The method of claim 9, wherein etching away the first mask is performed after forming the second mask.

12. The method of claim 9, wherein etching away the first mask includes an etch process that selectively removes material from the first mask without substantially damaging the second mask.

13. The method of claim 9, wherein the first doped area and the second region doped area abut one another without overlap.

14. The method of claim 9, wherein forming the first mask includes a lithographic process and wherein forming the second mask includes a deposition process followed by a chemical mechanical planarization process.

15. A method for doping a semiconductor layer, comprising:
   forming a first mask on a first region of a semiconductor layer by:
      forming an anti-reflection layer on the hardmask layer; and
      patterning the organic planarizing layer, the hardmask layer, and the anti-reflection layer to remove material from the organic planarizing layer, the hardmask layer, and the anti-reflection layer outside of the first region of the semiconductor layer;
   doping a second region of the semiconductor layer that is not covered by the first mask, using a second dopant species of a second conductivity type, to form a second doped area;
   forming a second mask on the second region of the semiconductor layer by:
   depositing a second mask material to a height above the first mask in both the first region and the second region; and
   polishing the second mask material down to a height of the hardmask layer, so that the anti-reflection layer and the second mask material is removed in the first region;
   etching away the first mask after forming the second mask using an etch process that selectively removes material from the first mask without substantially damaging the second mask; and
   doping the first region of the semiconductor layer, using a first dopant species of a first conductivity type, to form a first doped area that directly contacts, and does not overlap with, the second doped area.

* * * * *